United States Patent
Jung et al.

(10) Patent No.: US 10,020,050 B2
(45) Date of Patent: Jul. 10, 2018

(54) LOCAL BIT LINE-SHARING MEMORY DEVICE AND METHOD OF DRIVING THE SAME

(71) Applicant: INDUSTRY-ACADEMIC COOPERATION FOUNDATION, YONSEI UNIVERSITY, Seoul (KR)

(72) Inventors: Seong-Ook Jung, Seoul (KR); Tae Woo Oh, Seoul (KR); Hanwool Jeong, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/492,065

(22) Filed: Apr. 20, 2017

(65) Prior Publication Data

US 2017/0309328 A1    Oct. 26, 2017

(30) Foreign Application Priority Data

Apr. 21, 2016  (KR) .................. 10-2016-0048867

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
CPC ...................................................... G11C 11/419
USPC ................................................... 365/154, 156
See application file for complete search history.

(56) References Cited

U.S. PATENT DOCUMENTS

| 6,515,894 | B2* | 2/2003 | Osada ................. | G06F 12/0802 |
| | | | | 365/154 |
| 6,930,941 | B2* | 8/2005 | Nakase .................... | G11C 7/06 |
| | | | | 365/154 |
| 2011/0149667 | A1* | 6/2011 | Hamzaoglu ........... | G11C 11/412 |
| | | | | 365/203 |

FOREIGN PATENT DOCUMENTS

| JP | 2006-060233 A | 3/2006 |
| KR | 10-2014-0079445 A | 6/2014 |

* cited by examiner

*Primary Examiner* — Tha-O H Bui
(74) *Attorney, Agent, or Firm* — Sughrue Mion, PLLC

(57) ABSTRACT

Provided is a local bit line-sharing memory device, including a plurality of memory cells that share a local bit line pair; a pre-charging unit that is connected to a write bit line pair and pre-charges the local bit line pair; and a data reading unit that reads data when bit line voltage pre-charged in a memory cell selected from the memory cells is discharged.

5 Claims, 12 Drawing Sheets

<READ OPERATION>

<WRITE OPERATION>

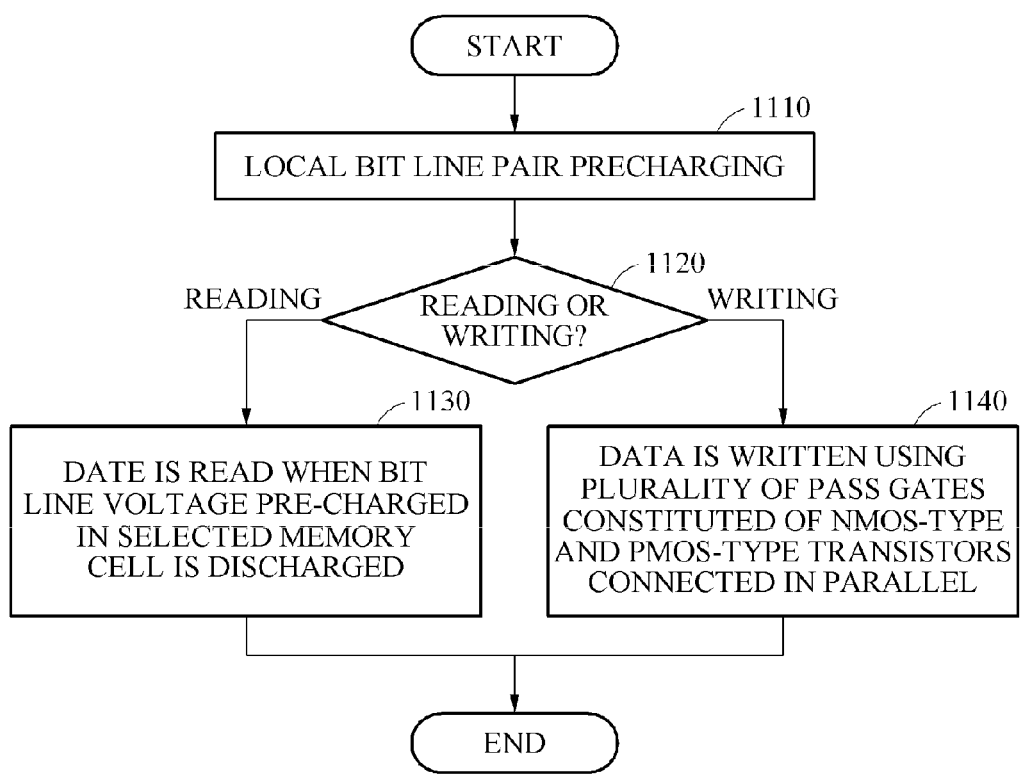

LOCAL BIT LINE-SHARING MEMORY DEVICE AND METHOD OF DRIVING THE SAME

CROSS-REFERENCE TO RELATED APPLICATION

This application claims the priority benefit of Korean Patent Application No. 10-2016-0048867, filed on Apr. 21, 2016 in the Korean Intellectual Property Office, the disclosure of which is incorporated herein by reference.

BACKGROUND OF THE DISCLOSURE

Field of the Disclosure

The present disclosure relates to a static memory for increasing the stability and speed of a reading function and a writing function and a method of driving the same.

Description of the Related Art

Dynamic Random Access Memory (DRAM) and Static Random Access Memory (SRAM) are generally used in volatile memory devices. With regard to SRAM, various circuit structures have been suggested to increase SRAM performance. In the case of 8T SRAM, which is realized using eight transistors, among such SRAM, data flip occurs due to similar read operation called a half-selected problem during write operation. To address such problem, a write-back operation is performed. However, in this case, problems related to a circuit area, delay time, or power consumption may occur.

Read speed may be increased by applying an average 8T SRAM with another structure using a boosted word line voltage. However, in this case, the stability of a read operation may be decreased.

A Full-Swing Local Bit-Line (FSLB) SRAM with another structure provides increased read speed and stability. However, in this case, write operation performance is decreased and read operation is delayed, due to NMOS connected in series. To compensate such problems, sufficient sensing margin or processing is required.

RELATED DOCUMENTS

Patent Documents

Korean Patent Application No. 10-2014-7011835, entitled "METHOD AND APPARATUS OF REDUCING LEAKAGE POWER IN MULTIPLE PORT SRAM MEMORY CELL"

Japanese Patent Application No. 2005-239627, entitled "MEMORY CELL STRUCTURE"

SUMMARY OF THE DISCLOSURE

Therefore, the present invention has been made in view of the above problems, and it is one object of the present invention to provide a local bit line-sharing memory device operating at high speed with low power consumption, and a method of driving the same.

More particularly, it is one object of the present invention to provide a memory device that uses a pre-charged local bit line pair to increase the stability and speed of read operation and uses a pass gate including PMOS and NMOS connected in parallel to increase write operation performance.

In accordance with an aspect of the present invention, the above and other objects can be accomplished by the provision of a local bit line-sharing memory device, including: a plurality of memory cells that share a local bit line pair; a pre-charging unit that is connected to a write bit line pair and pre-charges the local bit line pair; and a data reading unit that reads data when bit line voltage pre-charged in a memory cell selected from the memory cells is discharged.

The pre-charging unit may include a PMOS-type pre-charging transistor connected to the write bit line pair.

The pre-charging unit may charge the local bit line pair by bypassing the pre-charging transistor with power voltage applied to the write bit line pair in a holding operation step.

The data reading unit may charge read bit line to a voltage value of a read word line using the PMOS-type data read transistor connected to the local bit line pair.

The read bit line may be in a floating state prior to the data read operation.

Another local bit line-sharing memory device according to an embodiment of the present disclosure may further include a data recording unit for writing data, applied to the write bit line pair, to a memory cell selected from the memory cells.

The data recording unit may write the data at both ends of the write bit line pair using a plurality of pass gates, and the pass gates may include an NMOS-type transistor and a PMOS-type transistor connected in parallel with the NMOS-type transistor.

In accordance with another aspect of the present invention, there is provided a method of driving a local bit line-sharing memory device, the method including: pre-charging a local bit line pair by being connected to a write bit line pair; and performing data read or data write according to cases of a plurality of memory cells sharing the local bit line pair.

In the performing of the data read, data may be read when voltage of a bit line pre-charged in a memory cell selected from the memory cells is discharged.

In the performing of the date, the data may be written at both ends of the write bit line pair using a plurality of pass gates, and the pass gate may include an NMOS-type transistor and a PMOS-type transistor connected in parallel with the NMOS-type transistor.

BRIEF DESCRIPTION OF THE DRAWINGS

The above and other objects, features and other advantages of the present disclosure will be more clearly understood from the following detailed description taken in conjunction with the accompanying drawings, in which:

FIG. 11 is a flowchart illustrating a driving method of a local bit line-sharing memory device according to an embodiment of the present disclosure.

DETAILED DESCRIPTION OF THE DISCLOSURE

Figure 1:
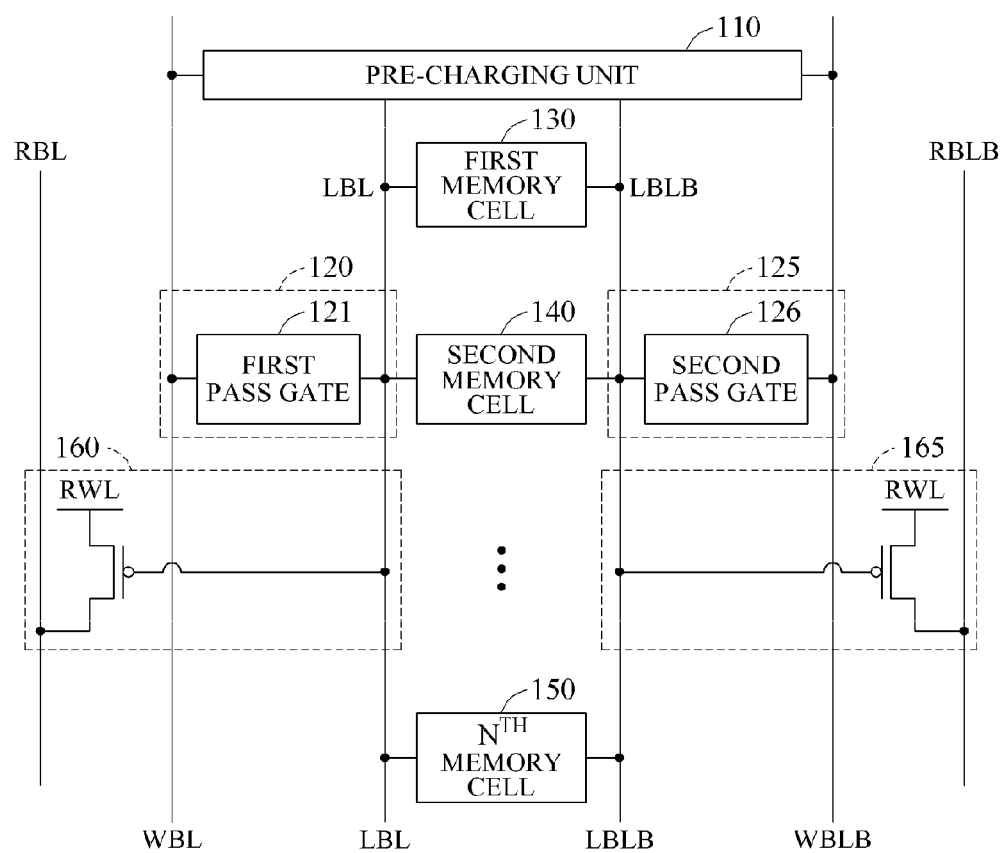
FIG. 1 illustrates a block diagram of a local bit line-sharing memory device according to an embodiment of the present disclosure.

Hereinafter, embodiments of the present disclosure are more fully described with reference to the accompanying drawings.

As the disclosure allows for various changes and numerous embodiments, particular embodiments are illustrated in the drawings and described in detail in the written description. The attached drawings for illustrating exemplary embodiments of the present disclosure are referred to clearly explain the effects and characteristics of the present disclosure and a method of accomplishing the present disclosure. The scope of the present disclosure is not limited to the following embodiments and can be embodied in various forms.

As used herein, the singular forms "a," "an" and "the" are intended to include the plural forms as well, unless the context clearly indicates otherwise.

It will be further understood that the terms "comprises" or "has" refer to the presence of features or constructions described herein, but do not preclude the possibility of one or more features or construction to be added.

In the following description, "decoding" refers to reading and "recording" refers to writing.

FIG. 1 illustrates a block diagram of a local bit line-sharing memory device according to an embodiment of the present disclosure.

Referring to FIG. 1, the local bit line-sharing memory device according to an embodiment of the present disclosure includes a pre-charging unit 110, a first data recording unit 120, a second data recording unit 125, a first memory cell 130, a second memory cell 140, an Nth memory cell 150, a first data reading unit 160, and a second data reading unit 165.

A plurality of memory cells shares a local bit line pair. The local bit line pair is constituted of a pair of a Local Bit Line (LBL) and a Local Bit Line Ba (LBLB). Here, each of the memory cells is constituted of SRAM. The first memory cell 130, the second memory cell 140, and the Nth memory cell 150 located in the Nth row constitute a plurality of memory cells.

The pre-charging unit 110 is connected to a Write Bit Line pair (WBL pair) and pre-charges the local bit line pair. The WBL pair is constituted of a pair of a Write Bit Line (WBL) and a Write Bit Line Ba (WBLB).

In an embodiment, the pre-charging unit 110 includes a PMOS-type pre-charging transistor connected to the WBL pair. The pre-charging unit 110 may activate the PMOS-type pre-charging transistor when low voltage is applied to a block signal (BLK).

The pre-charging unit 110 may charge the local bit line pair with by bypassing a pre-charging transistor with power voltage applied to the WBL pair in a holding operation step. A transistor, which transmits data from SRAM constituting memory cells, is constituted of NMOS. In the case of such an NMOS transistor, it takes a considerable time to transmit a charge value from 0 to 1. Accordingly, timing margin for delay time is required. However, when the local bit line pair has been charged to 1, the NMOS transistor consumes relatively less time to discharge the charge from 1 to 0, whereby delay time in transmitting data is considerably reduced. Accordingly, time required for data reading is reduced and power consumption is reduced.

The first data reading unit 160 is connected to the Local Bit Line (LBL) and the second data reading unit 165 is connected to the Local Bit Line Ba (LBLB). The first data reading unit 160 and the second data reading unit 165 read data when the voltage of LBL pre-charged in a memory cell selected from the memory cells is discharged. Here, the expression "discharged" refers to the case in which a bit value of LBL is changed from 1 to 0.

The first data reading unit 160 and the second data reading unit 165 may charge a Read Bit Line (RBL) to a voltage value of a Read Word Line (RWL) using a PMOS-type data read transistor connected to the local bit line pair. RBL may be set to a floating state prior to data read operation initiation.

The first data recording unit 120 and the second data recording unit 125 write data applied to the WBL pair to a memory cell selected for data writing among memory cells.

To write data to both ends of the WBL pair, the first data recording unit 120 uses a first pass gate 121 and the second data recording unit 125 uses a second pass gate 126. The first and second pass gates 121 and 126 include an NMOS-type transistor and a PMOS-type transistor connected in parallel with the NMOS-type transistor. Due to the NMOS-type transistor and the PMOS-type transistor connected in parallel, a resistance value on a data route is decreased and thus writing speed increases, whereby improved performance is provided.

Figure 2:
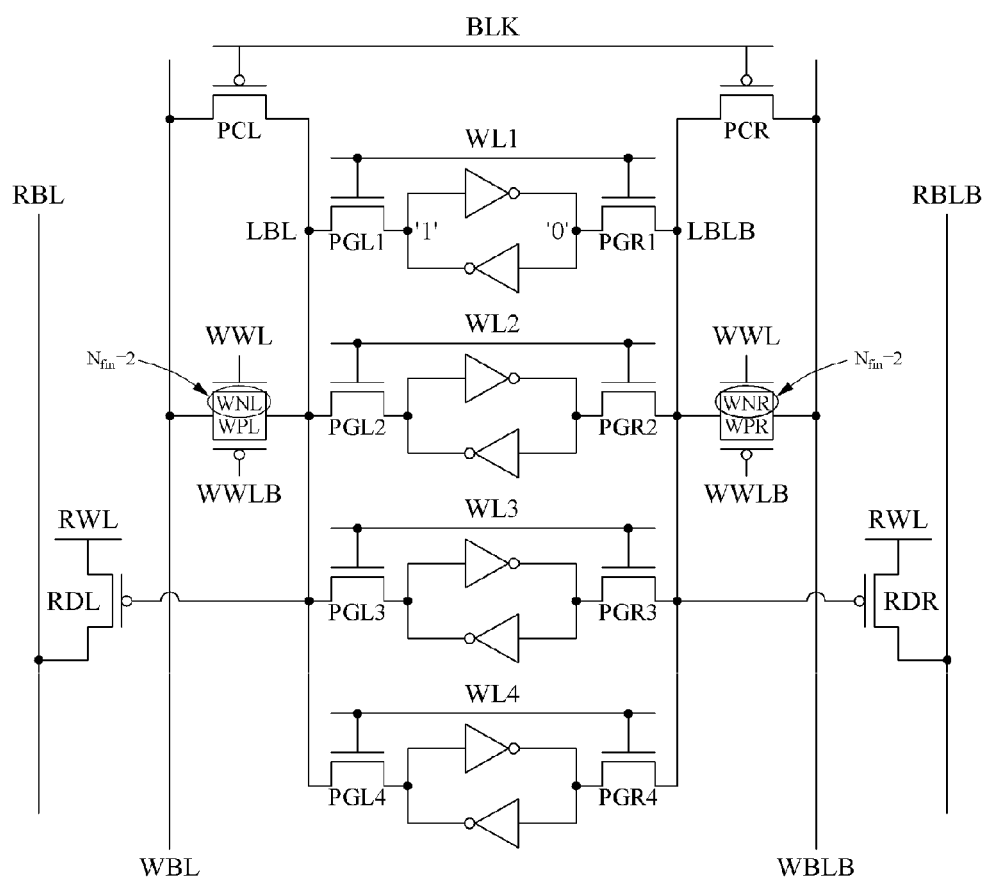
FIG. 2 illustrates a detailed circuit diagram of a local bit line-sharing memory device according to an embodiment of the present disclosure.

FIG. 2 illustrates a detailed circuit diagram of an LBL-sharing memory device according to an embodiment of the present disclosure.

Referring to FIG. 2, each of memory cells is constituted of an SRAM that is constituted of a word line, an inverter, and a data transmission transistor. The pre-charging unit 110 is constituted of a precharge transistor (PMOS type) formed in a pair with a block line. Each of the first and second pass gates 121 and 126 is constituted of a Write Word Line pair (WWL pair), an NMOS-type transistor, and a PMOS-type transistor. Writing speed increases with increasing number of NMOS-type transistors. Determination of an activated memory cell among the memory cells depends upon activation of the word line.

Figure 3:
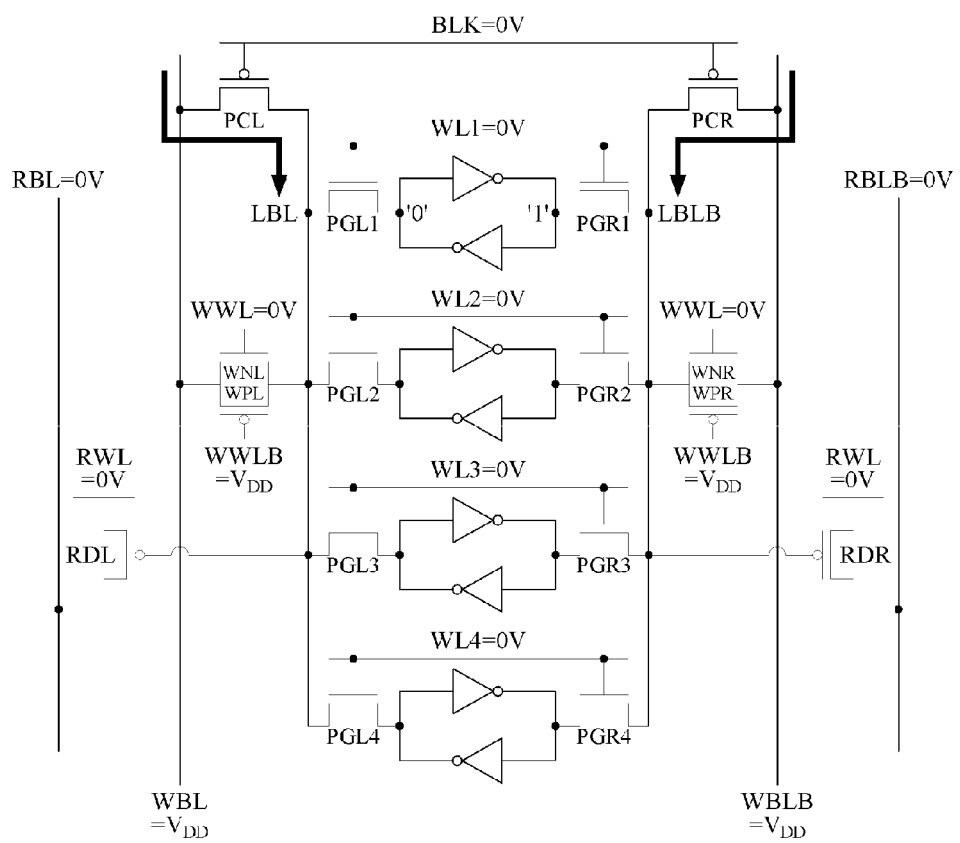
FIG. 3 illustrates an operation diagram of a local bit line-sharing memory device according to an embodiment of the present disclosure in a holding operation step.

FIG. 3 illustrates an operation diagram of an LBL-sharing memory device according to an embodiment of the present disclosure in a holding operation step.

Referring to FIG. 3, a memory cell is not selected because 0 V is applied to all word lines, a PMOS-type pre-charging transistor pair is activated because 0V is applied to a block line, and the WBL pair is connected to LBL. $V_{DD}$ is applied to the WBL pair, and thus, the local bit line pair is pre-charged. 0 V is applied to the write word lines and $V_{DD}$ is applied the write word line bars, whereby the first and second pass gates 121 and 126 are inactivated.

Figure 4:
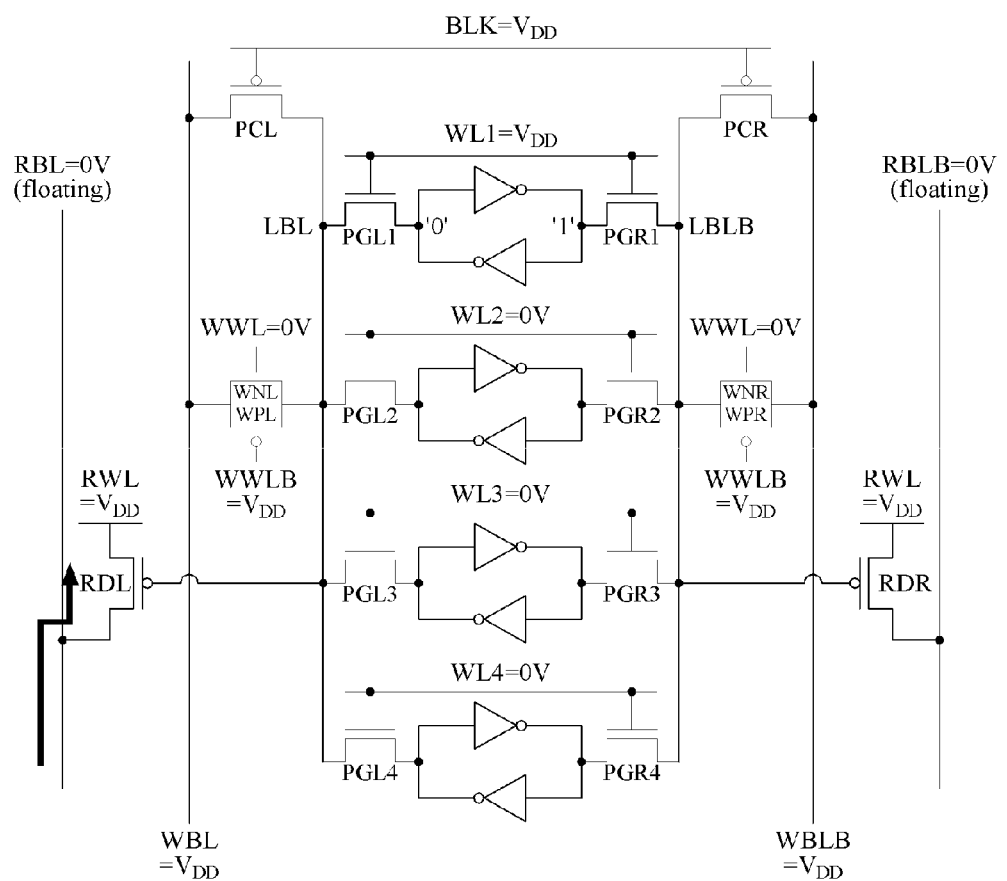
FIG. 4 illustrates an operation diagram of a local bit line-sharing memory device according to an embodiment of the present disclosure in a read operation step.

FIG. 4 illustrates an operation diagram of an LBL-sharing memory device according to an embodiment of the present disclosure in a read operation step.

Referring to FIG. 4, $V_{DD}$ is applied to the word line 1, whereby pass gate transistor pairs (PGL1, PGR1) are activated and a first memory cell is activated. Accordingly, connection to the local bit line pair is accomplished. 0 V is applied to the remaining word lines, thereby being inactivated. 0 V is applied to write word lines, $V_{DD}$ is applied to write word line bars, and $V_{DD}$ is applied to a block line, whereby the first pass gate 121, the second pass gate 126, and a precharge transistor pair are inactivated. As a result, the local bit line pair and the WBL pair are decoupled and thus mutual interference is eliminated.

According to a value applied to a gate of the PMOS-type data read transistor pair (RDL, RDR), a value applied to RWL may be charged to RBL. RBL may be set to a floating state by default. Due to values stored in the memory cells, the PMOS-type data read transistor (RDL) in a direction in which a value of LBL pre-charged to 1 in a holding operation step is changed into 0 may be activated and a pre-discharged RBL may be charged to $V_{DD}$.

Figure 5A:
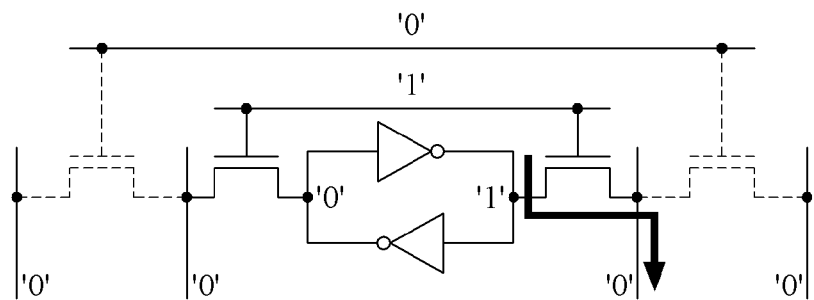
FIG. 5A~5C illustrate drawings for comparing read operation performance of an existing SRAM and a local bit line-sharing memory device according to an embodiment of the present disclosure.
Figure 5B:
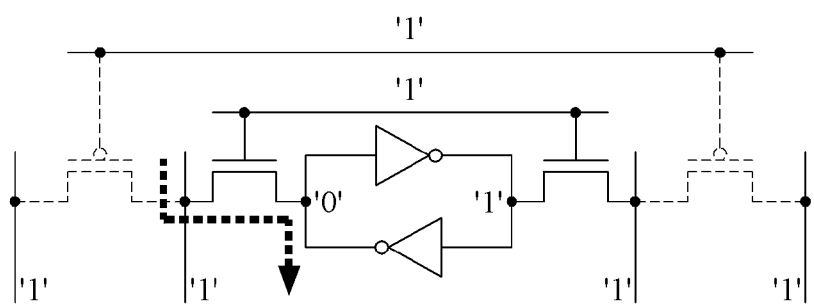
Figure 5C:
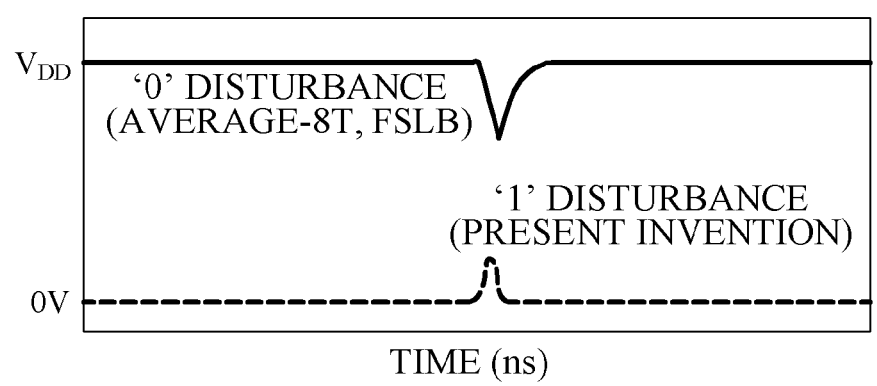

FIG. 5A~5C illustrates drawings for comparing read operation performance of an existing SRAM and an LBL-sharing memory device according to an embodiment of the present disclosure.

While both Average-8T and FSLB SRAM are pre-discharged to 0 V in a holding operation step, the LBL-sharing memory device according to an embodiment of the present disclosure is pre-charged to $V_{DD}$. Since, in the case of an NMOS pass gate transistor, it is difficult to pass 1, it takes a considerable time to charge to $V_{DD}$ when LBL is 0 V. Referring to FIG. 5A, since an LBL has been pre-discharged to 0 V in an existing SRAM, LBL takes time to reach $V_{DD}$. Meanwhile, "0" disturbance is a phenomenon wherein a memory cell value should be originally maintained at 1 ($V_{DD}$), but slight unintentional discharge occurs due to value 0 (0 V) of an LBL which has been pre-discharged. With regard to this, a smaller disturbance value is better. Referring to FIG. 5B, since the LBL-sharing memory device according to an embodiment of the present disclosure is in a state in which LBL thereof has been pre-charged to value 1 ($V_{DD}$), LBL, which has been pre-charged to $V_{DD}$, is more rapidly discharged to 0 V, compared to the case of FIG. 5A. Meanwhile, "1" disturbance refers to a case wherein a memory cell value should originally be 0, but is slightly charged due to LBL that has been pre-charged to value 1. With regard to this, a smaller disturbance value is better.

Referring to FIG. 5C, it can be confirmed that, in the case of "1" disturbance, stabilization to 0 V is relatively rapidly accomplished because a fluctuation range of a voltage value is not greater than 0 disturbance. Due to such effect, read performance of the LBL-sharing memory device according to an embodiment of the present disclosure is considered more stable, compared that of an existing SRAM.

Figure 6:
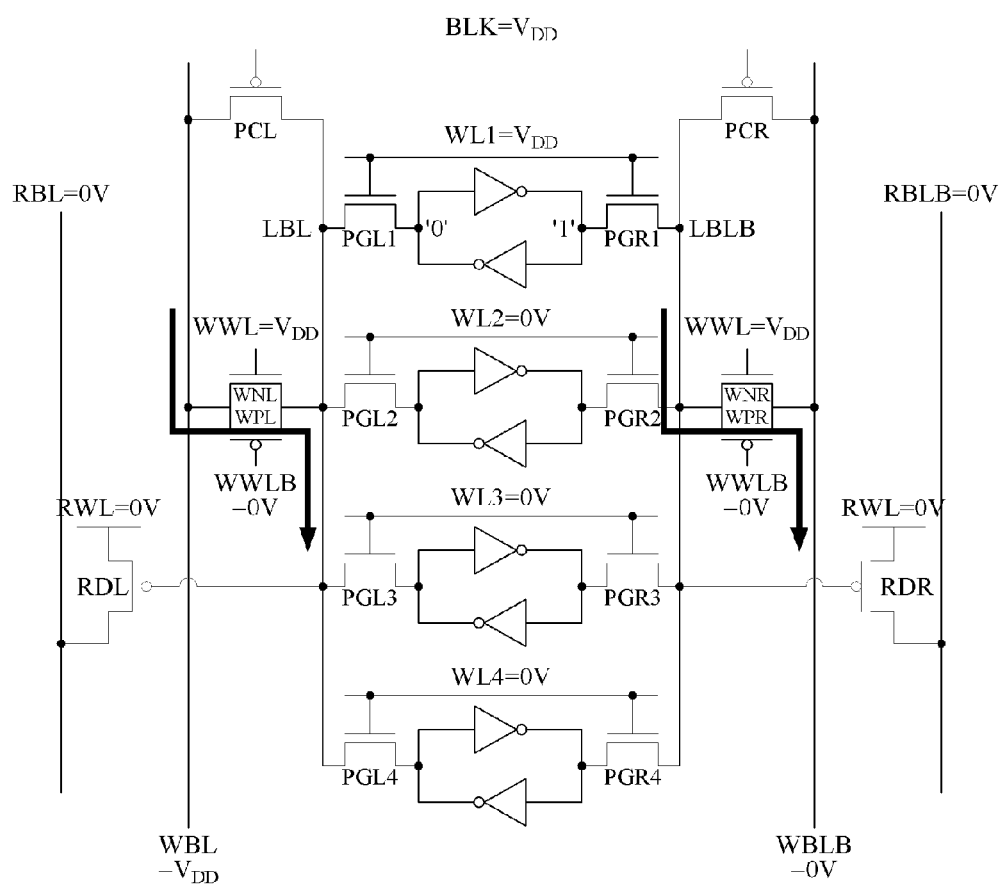
FIG. 6 illustrates an operation diagram of a local bit line-sharing memory device according to an embodiment of the present disclosure in a write operation step.

FIG. 6 illustrates an operation diagram of an LBL-sharing memory device according to an embodiment of the present disclosure in a write operation step.

Referring to FIG. 6, $V_{DD}$ is applied to the word line 1, and thus, a pass gate transistor pair (PGL1, PGR1) and a first memory cell are activated, thereby being connected to a local bit line pair. 0 V is applied to the remaining word lines, thereby being inactivated. $V_{DD}$ is applied to a write word line, 0 V is applied to a write word line bar, and $V_{DD}$ is applied to a block line, whereby first and second pass gates 121 and 126 are activated and a precharge transistor pair is inactivated. As a result, the local bit line pair and the WBL pair are connected through the first and second pass gates 121 and 126. 0 V is applied to RWL, whereby a read operation function is inactivated.

Data may be written to the first memory cell according to voltage applied to the WBL.

Figure 7A:
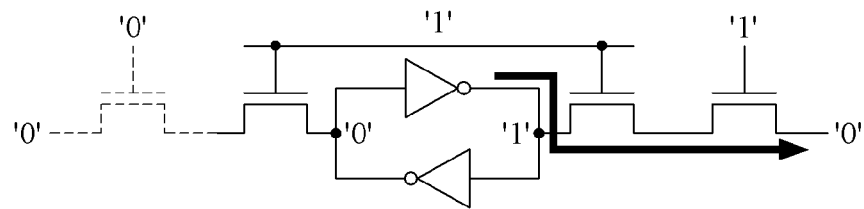
FIG. 7A~7C illustrate write operation manners of an existing SRAM and a local bit line-sharing memory device according to an embodiment of the present disclosure.
Figure 7B:
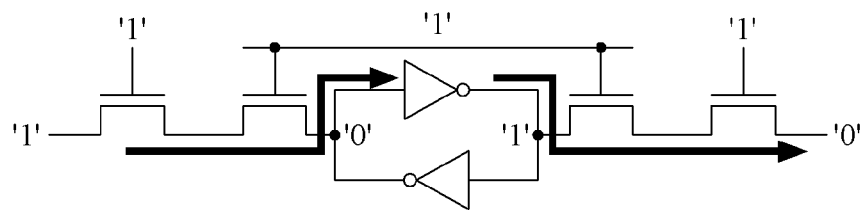
Figure 7C:
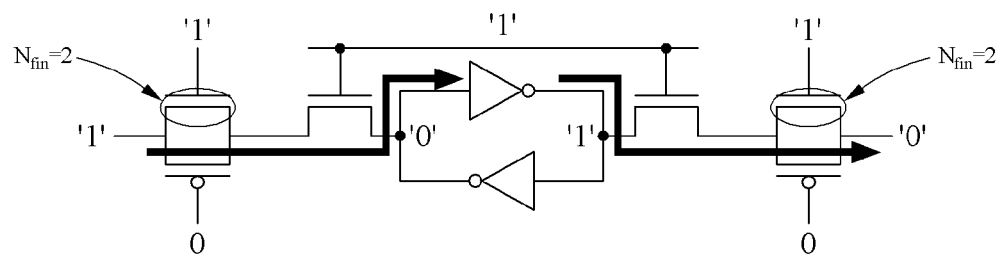

FIG. 7A~7C illustrate write operation manners of an existing SRAM and an LBL-sharing memory device according to an embodiment of the present disclosure.

FIG. 7A illustrates write operation of an average-8T SRAM. In this case, since a writing mechanism is operated at only one end of a memory cell, write performance is relatively decreased.

FIG. 7B illustrates write operation of FSLB SRAM. In this case, since a writing mechanism is utilized at both ends of a memory cell, write performance is improved, compared to the case of Average-8T SRAM.

FIG. 7C illustrates write operation of the LBL-sharing memory device according to an embodiment of the present disclosure. In this case, since a transmission gate is utilized as a pass gate and the number of NMOS-type pass gate transistors is greater than in the case of the FSLB SRAM, as well as a writing mechanism is utilized at both ends of a memory cell, write performance is improved, compared to the case of the FSLB SRAM.

Figure 8:
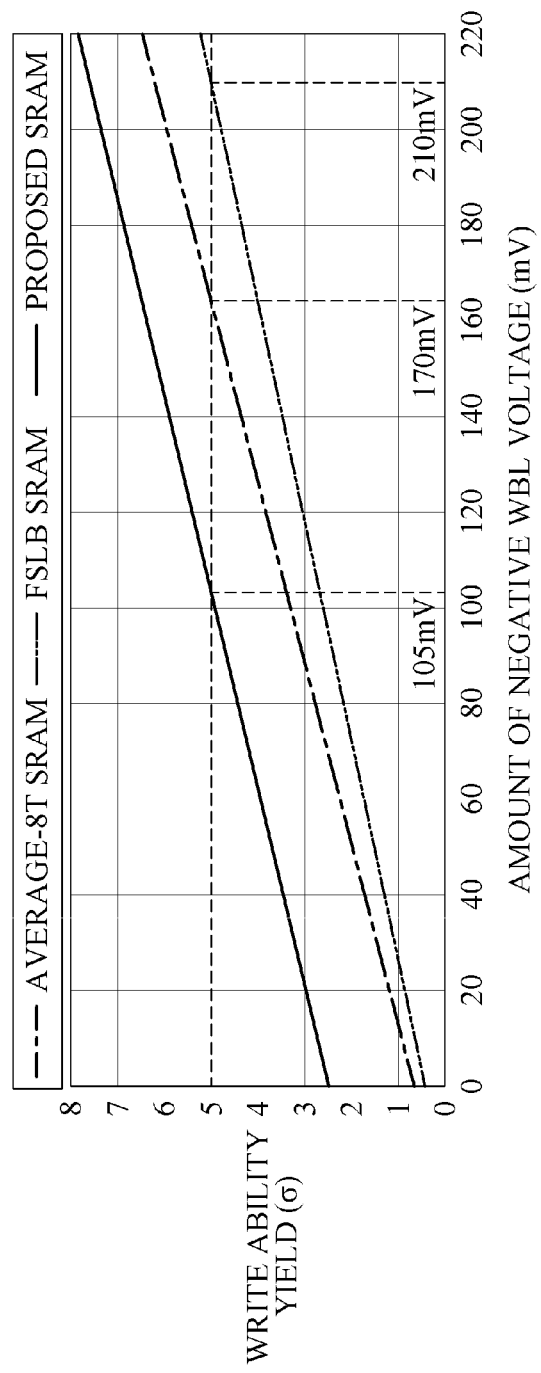
FIG. 8 illustrates a graph representing read performance of an existing SRAM and a local bit line-sharing memory device according to an embodiment of the present disclosure.

FIG. 8 illustrates a graph representing read performance of an existing SRAM and an LBL-sharing memory device according to an embodiment of the present disclosure.

Referring to FIG. 8, it can be confirmed that, in exhibiting the same write performance, a consumption amount of a boosting write bit line voltage in the LBL-sharing memory device according to an embodiment of the present disclosure (105 mV) is smaller than in the cases of Average-8T SRAM (170 mV) and FSLB SRAM (210 mV). Accordingly, assuming the same efficiency, a power consumption amount is lowest in the LBL-sharing memory device according to an embodiment of the present disclosure. Conversely, at the same voltage, write performance of the LBL-sharing memory device according to an embodiment of the present disclosure is the best.

FIG. 9A~9D illustrate delay time and performance in a read operation of an existing SRAM and an LBL-sharing memory device according to an embodiment of the present disclosure.

Figure 9A:
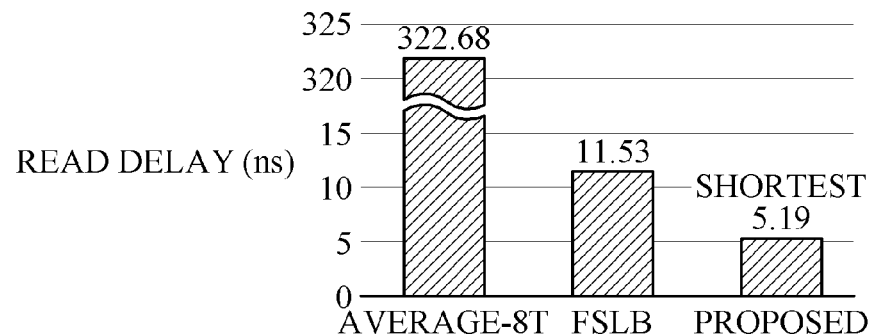
FIG. 9A~9D illustrate delay time and performance in a read operation of an existing SRAM and a local bit line-sharing memory device according to an embodiment of the present disclosure.

Referring to FIG. 9A, it can be confirmed that, with regard to read operation, the LBL-sharing memory device according to an embodiment of the present disclosure (5.19 ns) exhibits a smaller delay time, compared to the cases of Average-8T SRAM (322.68 ns) and FSLB SRAM (11.53 ns).

Figure 9B:
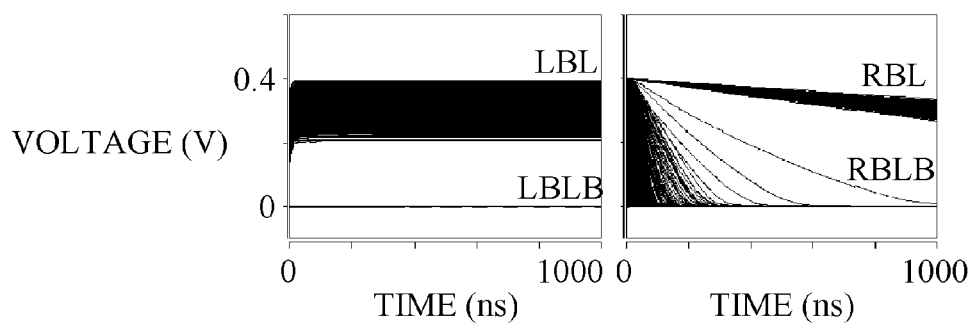

Referring to FIG. 9B, it can be confirmed that an LBL value of Average-8T SRAM only changes from 0 to about half of 0.4 and thus RBL consumes a considerable delay time to read data of a memory cell.

Figure 9C:
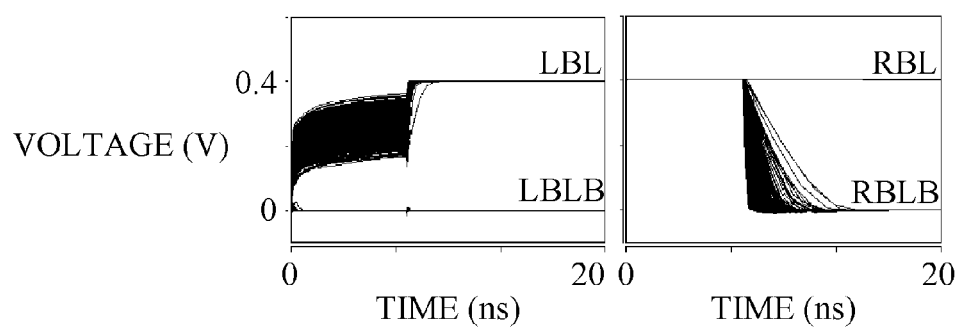

Referring to FIG. 9C, it can be confirmed that, although FSLB SRAM is faster than Average-8T SRAM, a value of LBL still changes from 0 to about half of 0.4 and then becomes 0.4 with a certain timing margin after a certain time, and the time for RBL to read data read is still delayed.

Figure 9D:
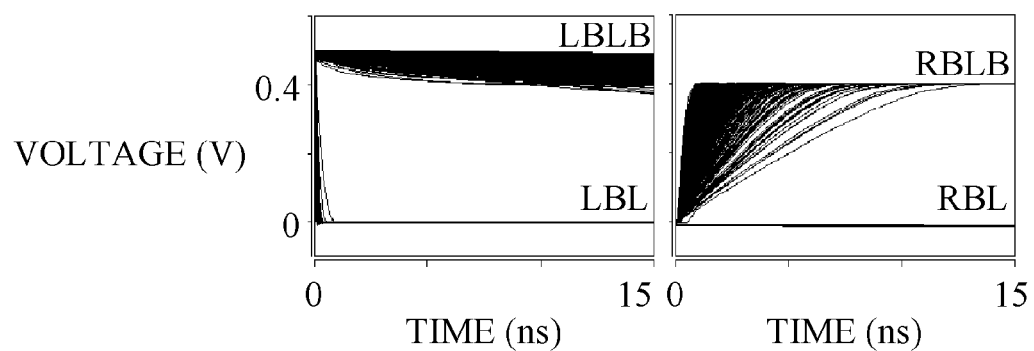

Referring to FIG. 9D, it can be confirmed that, in the case of the LBL-sharing memory device according to an embodiment of the present disclosure, a value of LBL rapidly changes from 0.4 to 0. Accordingly, in the case of the LBL-sharing memory device according to an embodiment of the present disclosure, delay time is greatly decreased, compared to other devices.

Figure 10:
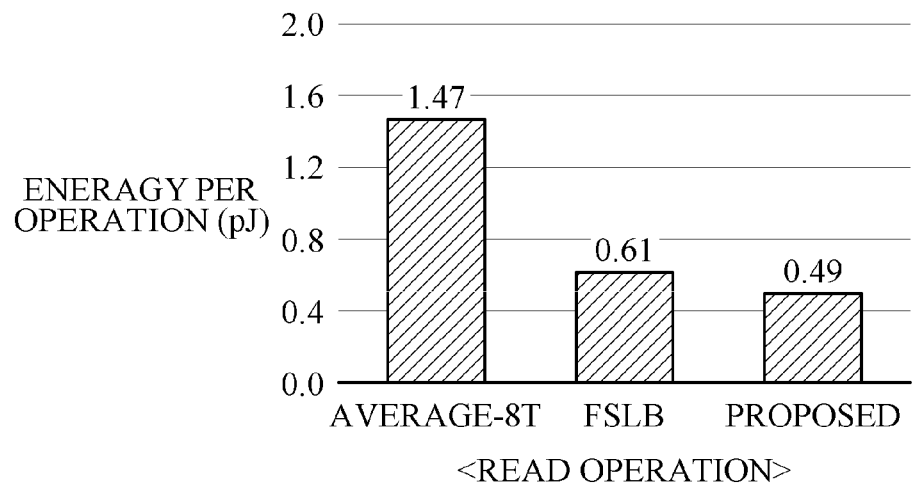
FIG. 10 illustrates energy consumption amounts in a read operation step and write operation step of an existing SRAM and a local bit line-sharing memory device according to an embodiment of the present disclosure.
Figure 10:
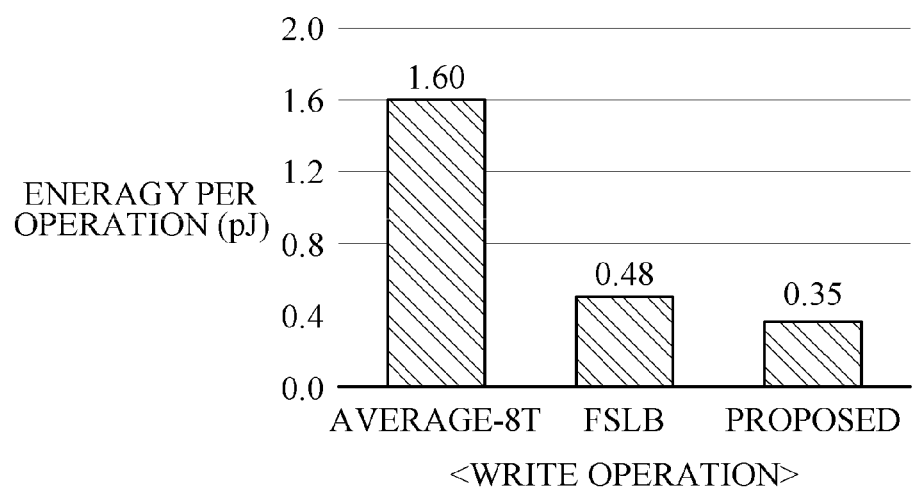

FIG. 10 illustrates energy consumption amounts in a read operation step and write operation step of an existing SRAM and an LBL-sharing memory device according to an embodiment of the present disclosure.

It can be confirmed that, in a read operation step, a reading delay time of the LBL-sharing memory device according to an embodiment of the present disclosure is smallest, and thus, energy consumption is lowest.

It can be confirmed that, in a write operation step, a boosting bit line voltage of the LBL-sharing memory device according to an embodiment of the present disclosure is smallest, and thus, energy consumption is lowest.

FIG. 11 is a flowchart illustrating a driving method of an LBL-sharing memory device according to an embodiment of the present disclosure.

In step 1110, the LBL-sharing memory device according to an embodiment of the present disclosure is connected to the WBL pair and pre-charges the local bit line pair.

In step 1120, the LBL-sharing memory device according to an embodiment of the present disclosure performs data read or data write according to cases of a plurality of memory cells sharing the local bit line pair.

In step 1130, the LBL-sharing memory device according to an embodiment of the present disclosure reads date when bit line voltage pre-charged in a memory cell selected from the memory cells is discharged.

In step 1140, the LBL-sharing memory device according to an embodiment of the present disclosure writes data at both ends of the WBL pair using a plurality of pass gates. Here, the pass gates include an NMOS-type transistor and a PMOS-type transistor connected in parallel with the NMOS-type transistor.

As apparent from the above description, an LBL-sharing memory device operating at high speed with low power consumption, and a method of driving the same are provided.

More particularly, a memory device that uses a pre-charged local bit line pair to increase the stability and speed of read operation and uses a pass gate including of PMOS and NMOS connected in parallel to increase write operation performance is provided.

The LBL-sharing memory device according to an embodiment of the present disclosure uses a pre-charged local bit line pair and thus removes timing margin to compensate delay time, thereby increasing read performance.

The LBL-sharing memory device according to an embodiment of the present disclosure may increase the performance of write operation and may reduce an energy consumption amount by minimizing the amount of wordline boosting and reducing delay time.

The aforementioned device may be realized by hardware component, a software component, and/or a combination of hardware and software components. For example, the device and components described in the embodiments may be realized using one or more general-purpose computers or special-purpose computers such as, for example, a processor, a controller, an arithmetic logic unit (ALU), a digital signal processor, a microcomputer, a field programmable array (FPA), a programmable logic unit (PLU), a microprocessor, or other devices implementing instructions and responding thereto. The processor may execute one or more software applications that run on an operating system (OS). In addition, the processor may approach data, store, manipulate, and process the data, and generate new data by responding to running of software. Although one processor has been used to aid in understanding, those skilled in the art can understand that the processor may include a plurality of processing elements and/or a plurality of processing element types. For example, the processor may include a plurality of processors or a combination of one processor and controller. Further, another processing configuration, such as a parallel processor, may be applied.

Software may include a computer program, code, instructions, or a combination of one or more of the foregoing, and may configure a processing device to operate as desired or independently or collectively a command to a processing device. Software and/or data may be permanently or temporarily embodied in the form of any type of machines, components, physical devices, virtual equipment, computer storage media or devices, or a signal wave to be transmitted, so as to be interpreted by a processing device or to provide a command or date to a processing device. Software may be distributed over a networked computer system, and stored or executed in a distributed manner. Software and data may be stored on one or more computer readable media.

Embodiments of the present invention can include a computer readable medium including program commands for executing operations implemented through various computers. The computer readable medium can store program commands, data files, data structures or combinations thereof. The program commands recorded in the medium may be specially designed and configured for the present invention or be known to those skilled in the field of computer software. Examples of a computer readable recording medium include magnetic media such as hard disks, floppy disks and magnetic tapes, optical media such as CD-ROMs and DVDs, magneto-optical media such as floptical disks, or hardware devices such as ROMs, RAMs and flash memories, which are specially configured to store and execute program commands. Examples of the program commands include a machine language code created by a compiler and a high-level language code executable by a computer using an interpreter and the like. The hardware devices may be configured to operate as one or more software modules to perform operations in the embodiments, and vice versa.

Although exemplary embodiments of the present invention have been disclosed for illustrative purposes, those skilled in the art will appreciate that various modifications, additions and substitutions are possible, without departing from the scope and spirit of the invention as disclosed in the accompanying claims. For example, proper result may be achieved even if the techniques described above are implemented in an order different from that for the disclosed method, and/or disclosed constituents such as a system, structure, device and circuit are coupled to or combined with each other in a form different from that for the disclosed method or replaced by other constituents or equivalents.

It should be understood, however, that there is no intent to limit the invention to the embodiments disclosed, rather, the invention is to cover all modifications, equivalents, and alternatives falling within the spirit and scope of the invention as defined by the claims.

DESCRIPTION OF SYMBOLS

110: PRE-CHARGING UNIT
120: FIRST DATA RECORDING UNIT
125: SECOND DATA RECORDING UNIT
121: FIRST PASS GATE

126: SECOND PASS GATE
130: FIRST MEMORY CELL
140: SECOND MEMORY CELL
150: N$^{TH}$ MEMORY CELL
160: FIRST DATA READING UNIT
165: SECOND DATA READING UNIT

What is claimed is:

1. A local bit line-sharing memory device, comprising:
a plurality of memory cells that share a local bit line pair;
a pre-charging unit that is connected to a write bit line pair and pre-charges the local bit line pair;
a data reading unit that reads data when a bit line of the local bit line pair voltage pre-charged in a memory cell selected from the memory cells is discharged, wherein the data reading unit charges a read bit line to a voltage value of a read word line using a PMOS-type data read transistor connected to the local bit line pair; and
a data recording unit for writing data, applied to the write bit line pair, to a memory cell selected from the plurality of memory cells,
wherein the data recording unit writes the data at both ends of the write bit line pair using a plurality of pass gates, and the pass gates comprise an NMOS-type transistor and a PMOS-type transistor connected in parallel with the NMOS-type transistor.

2. The local bit line-sharing memory device according to claim 1, wherein the pre-charging unit comprises a PMOS-type pre-charging transistor connected to the write bit line pair.

3. The local bit line-sharing memory device according to claim 2, wherein the pre-charging unit charges the local bit line pair by bypassing the pre-charging transistor with power voltage applied to the write bit line pair in a holding operation step.

4. The local bit line-sharing memory device according to claim 1, wherein the read bit line is in a floating state prior to the data read operation.

5. A method of driving a local bit line-sharing memory device, the method comprising:
pre-charging a local bit line pair by being connected to a write bit line pair; and
performing data read or data write according to cases of a plurality of memory cells sharing the local bit line pair,
wherein, in the performing of the data read, data is read when a bit line of the local bit line pair voltage pre-charged in a memory cell selected from the plurality of memory cells is discharged,
wherein, in the performing of the data read, a read bit line is charged to a voltage value of a read word line using a PMOS-type data read transistor connected to the local bit line pair, and
wherein, in the performing of the data write, data is written at both ends of the write bit line pair using a plurality of pass gates, and the pass gates comprise an NMOS-type transistor and a PMOS-type transistor connected in parallel with the NMOS-type transistor.

* * * * *